United States Patent
Yang et al.

(10) Patent No.: US 9,299,391 B2
(45) Date of Patent: Mar. 29, 2016

(54) THREE-DIMENSIONAL WORDLINE SHARING MEMORY

(71) Applicant: Taiwan Semiconductor Manufacturing Co., Ltd., Hsin-Chu (TW)

(72) Inventors: Hao-I Yang, Taipei (TW); Yi-Tzu Chen, Hsinchu (TW); Cheng-Jen Chang, Taoyuan (TW); Geng-Cing Lin, Taipei (TW); Yu-Hao Hu, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 53 days.

(21) Appl. No.: 14/159,464

(22) Filed: Jan. 21, 2014

(65) Prior Publication Data

US 2015/0206555 A1    Jul. 23, 2015

(51) Int. Cl.
| | |
|---|---|
| *G11C 5/02* | (2006.01) |
| *G11C 5/06* | (2006.01) |
| *G11C 8/14* | (2006.01) |
| *H01L 27/115* | (2006.01) |

(52) U.S. Cl.
CPC .............. *G11C 5/025* (2013.01); *G11C 5/063* (2013.01); *G11C 8/14* (2013.01); *H01L 27/11551* (2013.01)

(58) Field of Classification Search
CPC ............... H01L 27/11551; H01L 27/11578; H01L 2224/48145; H01L 27/0688; H01L 2225/06541; G11C 2213/71; G11C 8/14
USPC .................. 365/185.11, 51, 63, 154, 174
See application file for complete search history.

(56) References Cited

U.S. PATENT DOCUMENTS

| | | | |
|---|---|---|---|
| 2012/0320698 A1* | 12/2012 | Itagaki et al. | 365/218 |
| 2014/0241090 A1* | 8/2014 | Chen et al. | 365/207 |
| 2015/0121052 A1* | 4/2015 | Emma et al. | 713/1 |

\* cited by examiner

*Primary Examiner* — Fernando Hidalgo
(74) *Attorney, Agent, or Firm* — Duane Morris LLP

(57) ABSTRACT

A three dimensional (3D) circuit includes a first layer including at least a first memory cell, a second layer including at least a second memory cell, and a wordline shared by the first memory cell and the second memory cell. The first and second memory cells can be adjacent memory cells or bit cells coupled to different bit lines.

18 Claims, 7 Drawing Sheets

THREE-DIMENSIONAL WORDLINE SHARING MEMORY

FIELD OF DISCLOSURE

The disclosed circuits and methods relate to semiconductor memories. More particularly, the disclosed circuits and methods relate to three-dimensional semiconductor memories using wordline sharing.

BACKGROUND

Static random access memories ("SRAM") include a plurality of cells disposed in rows and columns to form an array. SRAM cells include a plurality of transistors coupled to bit lines and wordlines that are used to read and write a bit of data to the memory cell. In two-dimensional memories, memory cells and wordlines are in the same plane. Wordline length increases as word width increases. As a result of longer wordline length, power consumption increases and overall performance degrades.

DETAILED DESCRIPTION

This description of the exemplary embodiments is intended to be read in connection with the accompanying drawings, which are to be considered part of the entire written description.

The disclosed circuits advantageously reduce issues that can affect conventional two-dimensional semiconductor memories by decreasing resistance and capacitance as a result of reduced wordline lengths. Additionally, the disclosed circuits improves the performance of a semiconductor memory (e.g., power, speed and area).

Figure 1:
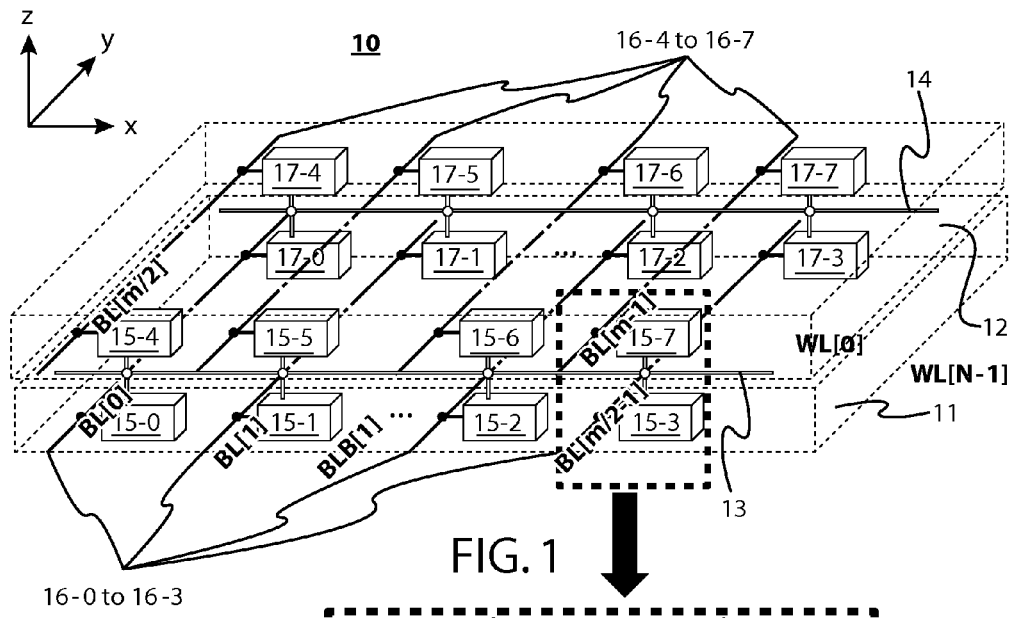
FIG. 1 is a perspective view of one example of a three-dimensional semiconductor integrated circuit with bit cells on different vertical layers sharing the same wordline in accordance with some embodiments.

FIG. 1 illustrates one example of a three-dimensional ("3D") semiconductor integrated circuit ("IC") 10. 3D IC 10 includes a plurality of layers such as layers 11 and 12 that are vertically stacked on top of one another in the z-direction. In some embodiments, layers 11 and 12 are individual dies that are electrically coupled to one another with at least one through-substrate via ("TSV") or inter-layer via ("ILV") (not shown). In some embodiments, 3D IC 10 is a 3D IC such that each layer 12 is a respective "tier" where each tier includes a respective active device layer and a respective interconnect structure, which can include a plurality of conductive layers (e.g., M1, M2, etc.). Interlayer dielectric ("ILD") layers (not shown) can be disposed between directly adjacent tiers as will be understood by one of ordinary skill in the art.

3D IC 10 includes an array of bit cells arranged across the two layers 11 and 12. Bit cells 15-0 through 15-3 and 17-0 through 17-3 are disposed on the first layer 11 and bits cells 15-4 through 15-7 and 17-4 through 17-7 are disposed on the second layer 12. Bit cells 15-0 through 15-3 and 15-4 through 15-7 share the same wordline 13, which is located between vertically adjacent bit cells in respective layers 11 and 12. In some embodiments the wordline 13 can be embedded within a portion of layer 11 and in other embodiments the wordline can be embedded within a portion of layer 12. In some embodiments, the wordline 13 can be disposed between layers 11 and 12 as a separate layer. Similarly, bit cells 17-0 through 17-3 and 17-4 through 17-7 share the same wordline 14, which is located between vertically adjacent bit cells in respective layers 11 and 12. The 3D IC further includes a plurality of bit lines (BL[0] through BL[m−1], where m is the number of bit cells in a word). The 3D IC 10 can also include a plurality of complementary bit lines (BLB). Bit lines 16-0 to 16-3 can correspondingly drive bit cells 15-0 through 15-3 and/or bit cells 17-0 through 17-3. Bit lines 16-4 to 16-7 can correspondingly drive bit cells 15-4 through 15-7 and/or bit cells 17-4 through 17-7.

Figure 1A:
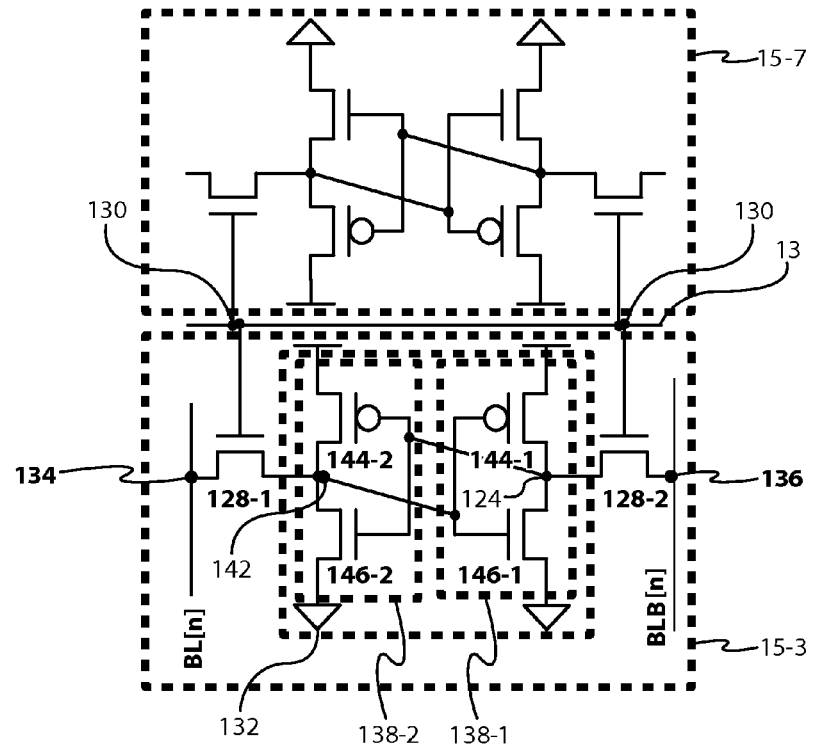
FIG. 1A is a circuit diagram of bit cells from different vertical layers sharing the same wordline in accordance with some embodiments.

FIG. 1A illustrates further detail of one example of a pair of vertically stacked bit cells 15-7 and 15-3 as shown in FIG. 1 in accordance with some embodiments. Bit cell 15-3 is a mirror image of bit cell 15-7, thus for simplicity bit cell 15-3 is described below. Bit cell 15-3 includes a pair of pass transistors 128-1, 128-2 each having its respective gate coupled to the same wordline 13 at node 130 and its respective drain coupled to latch 132. The source of transistor 128-1 is coupled to a bit line, BL[n] at node 134, and the source of transistor 128-2 is coupled to complementary bit line BLB[n] at node 136. Latch 132 includes a pair of cross-coupled inverters 138-1 and 138-2, which are arranged such that that output of inverter 138-1 is coupled to the input of inverter 138-2 at node 124, and the output of inverter 138-2 is coupled to the input of inverter 138-1 at node 142. Node 142 is also coupled to the drain of transistor 128-1.

As shown in FIG. 1A, in some embodiments, inverters 138-1, 138-2 each include a pair of transistors. For example, inverter 138-1 includes transistors 144-1 and 146-1, and inverter 138-2 includes transistors 144-2 and 146-2. In some embodiments, transistors 144-1, 144-2 are PMOS transistors and transistors 146-1, 146-2 are NMOS transistors. However, transistors 144-1, 144-2, 146-1, 146-2 can be implemented as other transistor types.

Transistor 144-1 has its source coupled to a node, which in some embodiments is coupled to a power supply node set at VDD. The drain of transistor 144-1 is coupled to node 124, and the gate of transistor 144-1 is coupled to node 142, which serves as the input of inverter 138-1. Transistor 146-1 has its drain coupled to node 124, its source coupled ground or VSS, and is gate coupled to node 142.

Transistor 144-2 of inverter 138-2 has its source coupled to a node coupled to VDD, its drain coupled to node 142, and its gate coupled to node 124. Node 142 is coupled to the drain of transistor 128-1 and is configured as the output of inverter 138-2 and the input of inverter 138-1. Transistor 146-2 of inverter 138-2 has its source coupled to ground or VSS, its drain coupled to node 142, and its gate coupled to node 124. Although the bit cell 15-3 illustrated in FIG. 1A is shown as a six transistor ("6T") bit cell, one of ordinary skill in the art will understand that bit cell 15-3 (as well as bit cell 15-7) can have other implementations with fewer or more transistors. Note, the embodiments illustrated generally refer to SRAM cells and are not limited thereto. Some embodiments include other types of memories such as DRAM cells that include a plurality of transistors coupled to bit lines and wordlines that are used to read and write a bit of data to the memory cell.

Figure 2:
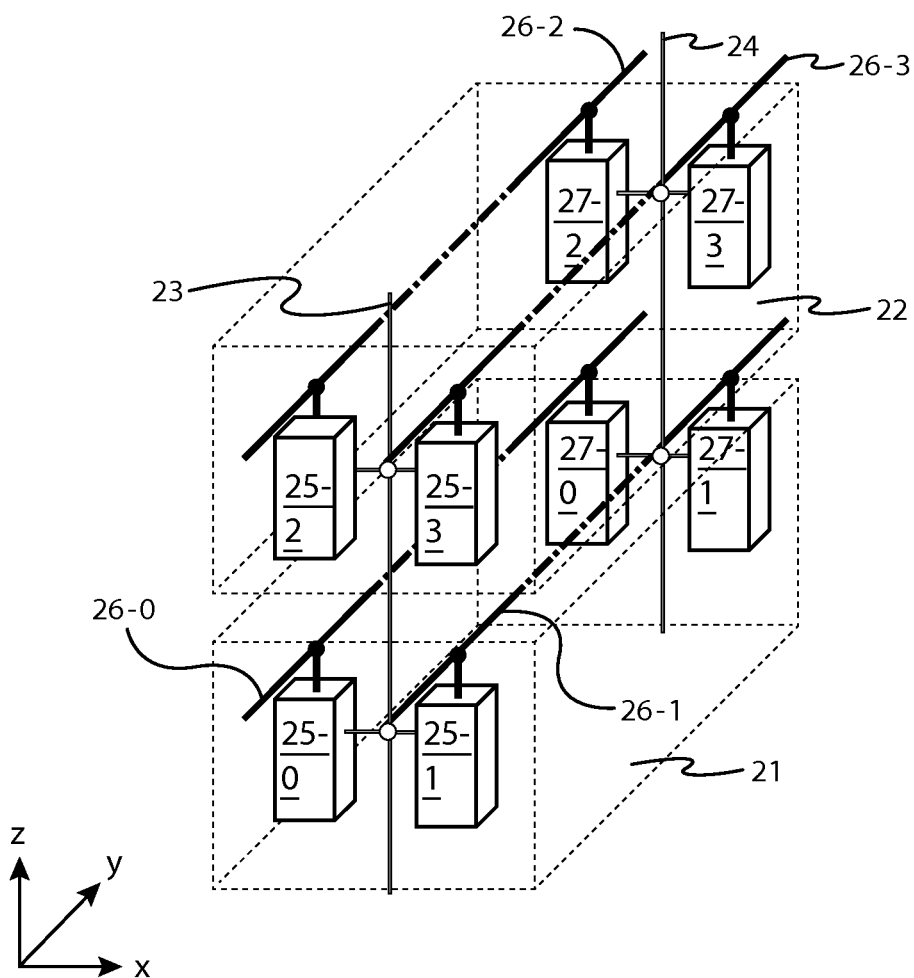
FIG. 2 is a perspective view of a three-dimensional semiconductor integrated circuit with adjacent bit cells in the same layer and bit cells on different layers sharing the same wordline in accordance with some embodiments.

FIG. 2 illustrates one example of a 3D IC 20 that includes a plurality of layers such as layers 21 and 22 that are vertically stacked on top of one another in the z-direction. In some embodiments, layers 21 and 22 are individual dies that are electrically coupled to one another with at least one through-substrate via ("TSV") or an inter-layer via ("ILV") or inter-device via ("IDV") (not shown). In some embodiments, 3D IC 20 is a 3D IC such that each layer 21 and 22 is a respective "tier" where each tier includes a respective active device layer and a respective interconnect structure, which can include a plurality of conductive layers (e.g., M1, M2, etc.). Interlayer dielectric ("ILD") layers (not shown) can be disposed between directly adjacent tiers as will be understood by one of ordinary skill in the art.

3D IC 20 includes an array of bit cells arranged across the two layers 21 and 22. Bit cells 25-0 through 25-1 and 27-0 through 27-1 are disposed on the first layer 21 and bits cells 25-2 through 25-3 and 27-2 through 27-3 are disposed on the second layer 22 as shown. Bit cells 25-0 through 25-3 share the same vertical wordline 23. Similarly, bit cells 27-0 through 27-3 share the same vertical wordline 24. The 3D IC 20 further includes a plurality of bit lines. Bit line 26-0 drives bit cells 25-0 and 27-0, Bit line 26-1 drives bit cells 25-1 and 27-1, Bit line 26-2 drives bit cells 25-2 and 27-2, and bit line 26-3 correspondingly drive bit cells 25-3 and/or bit 27-3.

Figure 3:
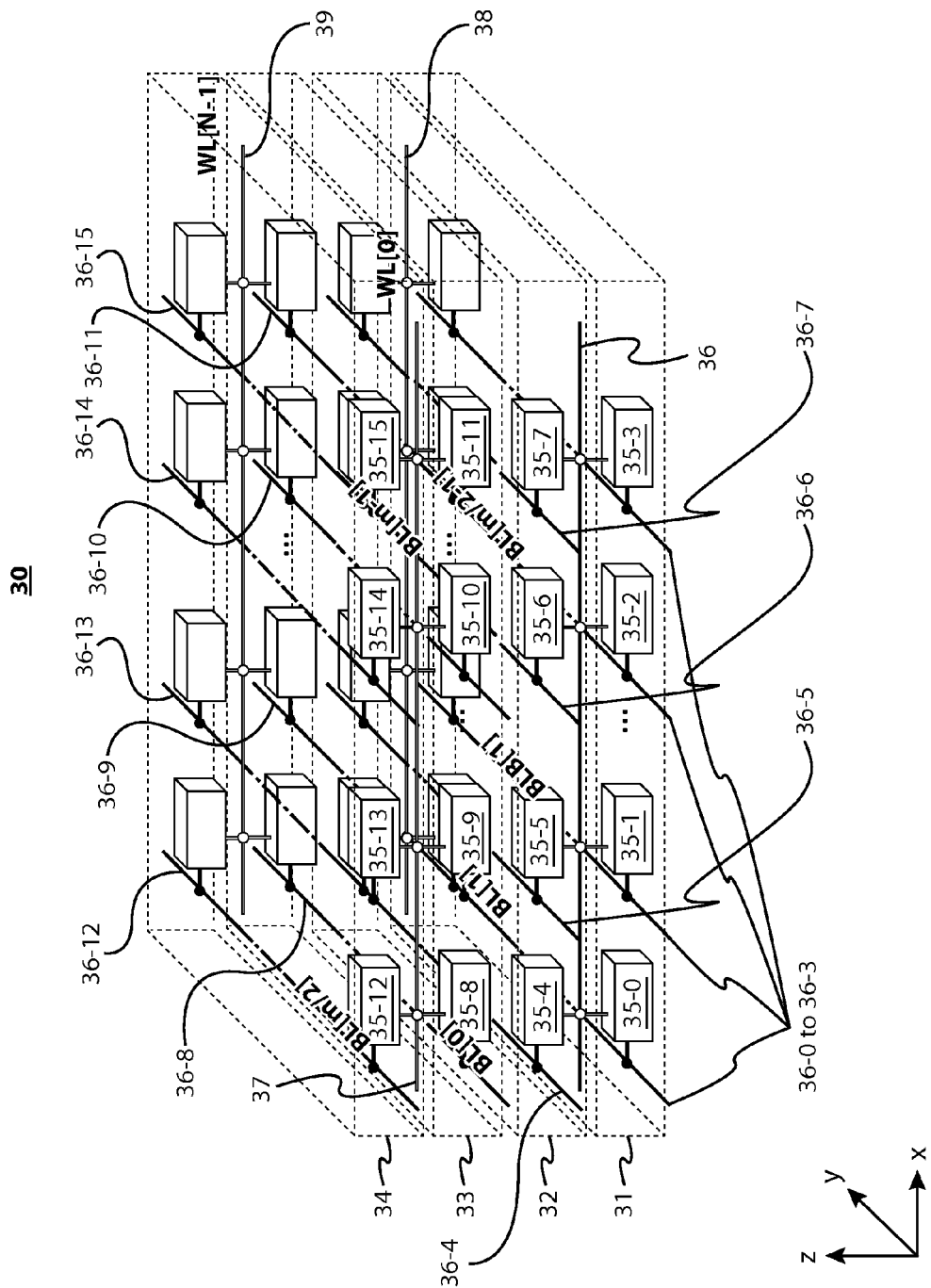
FIG. 3 is a perspective view of a three-dimensional semiconductor integrated circuit with bit cells on different vertical layers sharing the same wordline similar to FIG. 1 and in accordance with some embodiments.

FIG. 3 is a perspective view of a three-dimensional semiconductor integrated circuit 30 with bit cells formed on different vertical layers 31 and 32 sharing the same wordlines 36 and 38 and with bit cells on yet other vertical layers 33 and 34 sharing the same wordlines 37 and 39 in accordance with some embodiments. In this embodiment, adjacent bit cells residing on separate stacked layers and residing above and below a wordline share the same wordline. For example, bit cells 35-0 through 35-3 of layer 31 share the same wordline 36 with corresponding bit cells 35-4 through 35-7 of layer 32. Note, in some embodiments the wordline 36 can be embedded in layer 31 or in layer 32, as long as wordline 36 is coupled to corresponding sets of bit cells formed in different layers. Bit cells 35-8 through 35-11 of layer 33 share the same wordline 37 with corresponding bit cells 35-12 through 35-15 of layer 34. Wordlines 37 and 39 similarly share bit cells on an opposing side of the 3D IC 30. The 3D IC 30 further includes a plurality of bit lines. Bit lines 36-0 through 36-15 are coupled to cells 35-0 through 35-15 and a corresponding set of bit cells, which are coupled to wordline 38 or wordline 39. This embodiment illustrates the sharing by memory or bit cells across layers above and below (or up and down from in the z-direction) a shared horizontal (x- and y-directions) wordline.

Figure 4:
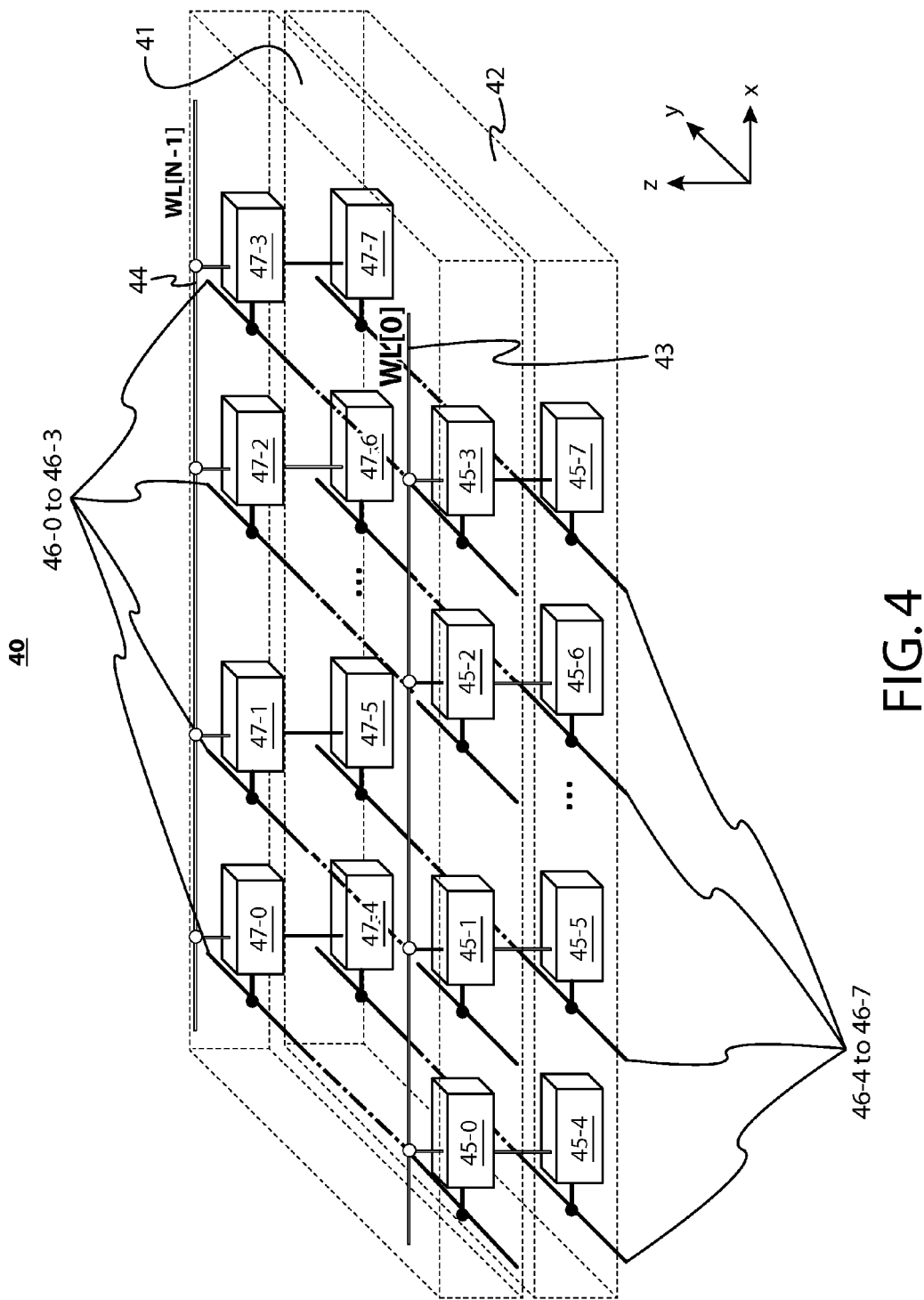
FIG. 4 is a perspective view of a three-dimensional semiconductor integrated circuit with bit cells on two different vertical layers below a shared wordline in accordance with some embodiments.

FIG. 4 illustrates a 3D IC 40 with bit cells formed on two different vertical layers that are positioned below a shared wordline (43 or 44) in accordance with some embodiments. 3D IC 40 includes a plurality of layers such as layers 41 and 42 that are vertically stacked on top of one another in the z-direction. In some embodiments as explained above, layers 41 and 42 are individual dies that are electrically coupled to one another with at least one through-substrate via ("TSV"), inter-layer via ("ILV"), or inter-device via ("IDV") (not shown). In some embodiments, each layer 41 and 42 of 3D IC 40 is a respective "tier" where each tier includes a respective active device layer and a respective interconnect structure, which can include a plurality of conductive layers (e.g., M1, M2, etc.). Interlayer dielectric ("ILD") layers (not shown) can be disposed between directly adjacent tiers as will be understood by one of ordinary skill in the art.

3D IC 40 includes an array of bit cells arranged across the two layers 41 and 42. Bit cells 45-0 through 45-3 and 47-0 through 47-3 are disposed on the first layer 41 and bits cells 45-4 through 45-7 and 47-4 through 47-7 are disposed on the second layer 42. Bit cells 45-0 through 45-3 and 45-4 through 45-7 correspondingly share the same wordline 43 residing above bit cells 45-0 through 45-7. Bit cells 47-0 through 47-7 share the same wordline 44, which is disposed above bit cells 47-0 through 47-7. In some embodiments, wordlines 43 and 44 can be embedded in layer 41 (as part of a metal layer M1, M2, M3, etc.) or can alternatively be disposed above layer 41. Bit lines 46-0 to 46-3 are coupled to bit cells 15-0 through 15-3 and/or bit cells 47-0 through 47-3. Bit lines 46-4 to 46-7 are coupled to bit cells 45-4 through 45-7 and/or bit cells 47-4 through 47-7.

Figure 5:
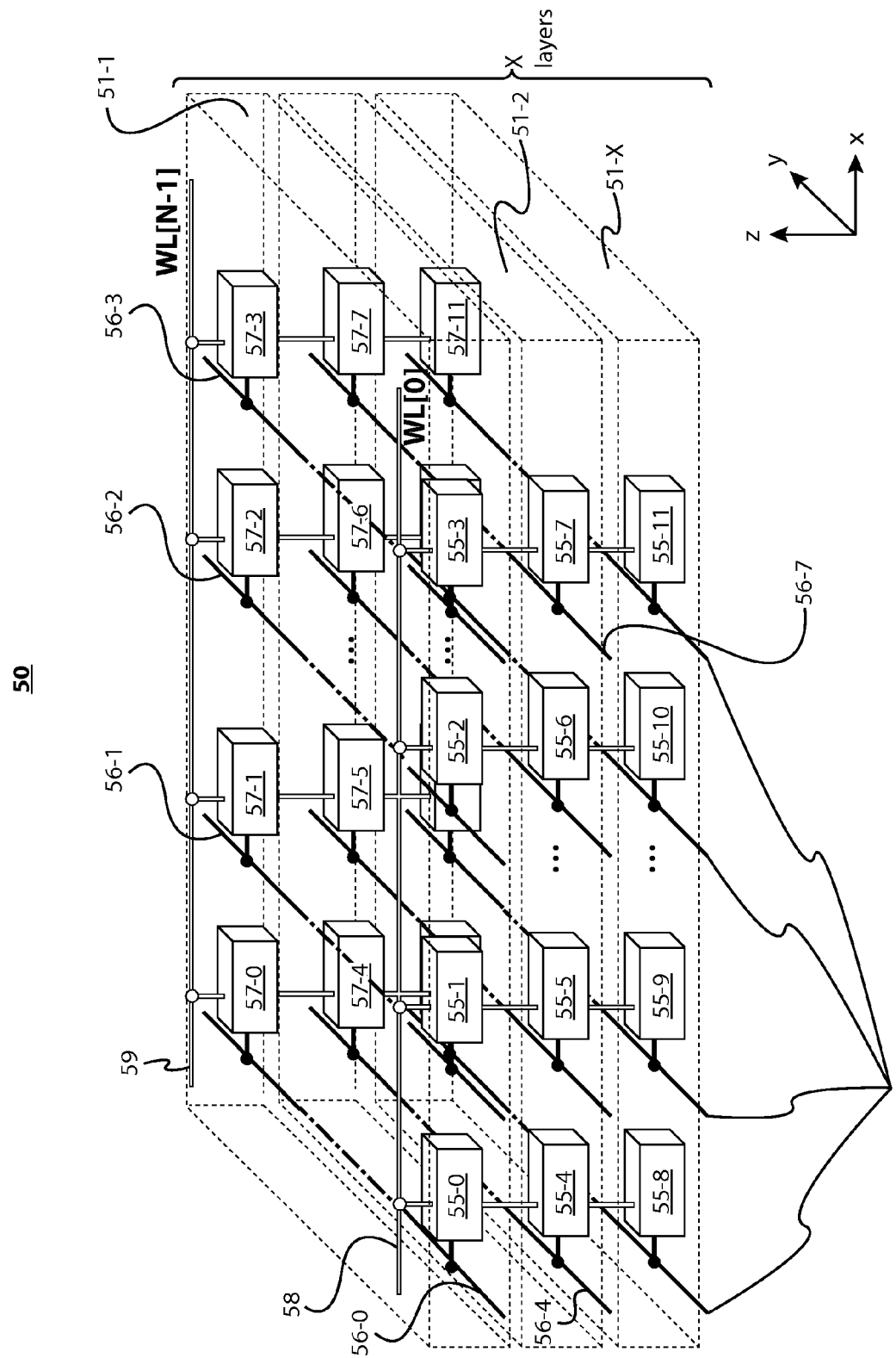
FIG. 5 is a perspective view of a three-dimensional semiconductor integrated circuit with bit cells on a predetermined number of different vertical layers below a shared wordline in accordance with some embodiments.

FIG. 5 illustrates a 3D IC 50 with bit cells on a number, X, of different vertical layers with the bit cells being positioned below a shared wordline (58 or 59) in accordance with some embodiments. 3D IC 50 includes a plurality of layers such as layers 51-1, 51-2 to 51-X that are vertically stacked on top of one another in the z-direction. In some embodiments as explained above, layers 51-1, 51-2 to 51-X are individual dies that are electrically coupled to one another with at least one TSV, ILV, or IDV (not shown). In some embodiments, 3D IC 50 is a 3D IC such that each layer 51-1, 51-2 to 51-X is a respective "tier" where each tier includes a respective active device layer and a respective interconnect structure, which can include a plurality of conductive layers (e.g., M1, M2, etc.). ILD layers (not shown) can be disposed between directly adjacent tiers as will be understood by one of ordinary skill in the art.

3D IC 50 includes an array of bit cells arranged across the X number of layers below the wordlines 58 and 59. Bit cells 55-0 through 55-3 and 57-0 through 57-3 are disposed on the first layer 51-1, bits cells 55-4 through 55-7 and 57-4 through 57-7 are disposed on the second layer 51-2, and bits cells 55-8 through 55-11 and 57-8 (not shown) through 57-11 are disposed on the Xth layer 51-X. Bit cells 55-0 through 55-3, 55-4 through 55-7 and 55-8 through 55-11 correspondingly share the same wordline 58 residing above bit cells 55-0 through 55-11. Bit cells 57-0 through 57-3, 57-4 through 57-7, and 57-8 through 57-11 correspondingly share the same wordline 59 residing above bit cells 57-0 through 57-11. In some embodiments, wordlines 58 and 59 can be embedded in layer 51-1 or can alternatively be disposed above layer 51-1. Bit lines 56-0 to 56-3 can correspondingly drive or are driven by bit cells 55-0 through 55-3 and/or bit cells 57-0 through 57-3. Bit lines 56-4 to 56-7 can correspondingly drive bit cells 55-4 through 55-7 and/or bit cells 57-4 through 57-7. Bit lines 56-8 to 56-11 can correspondingly drive or be driven by bit cells 55-8 through 55-11 and/or bit cells 57-8 through 57-11.

Figure 6:
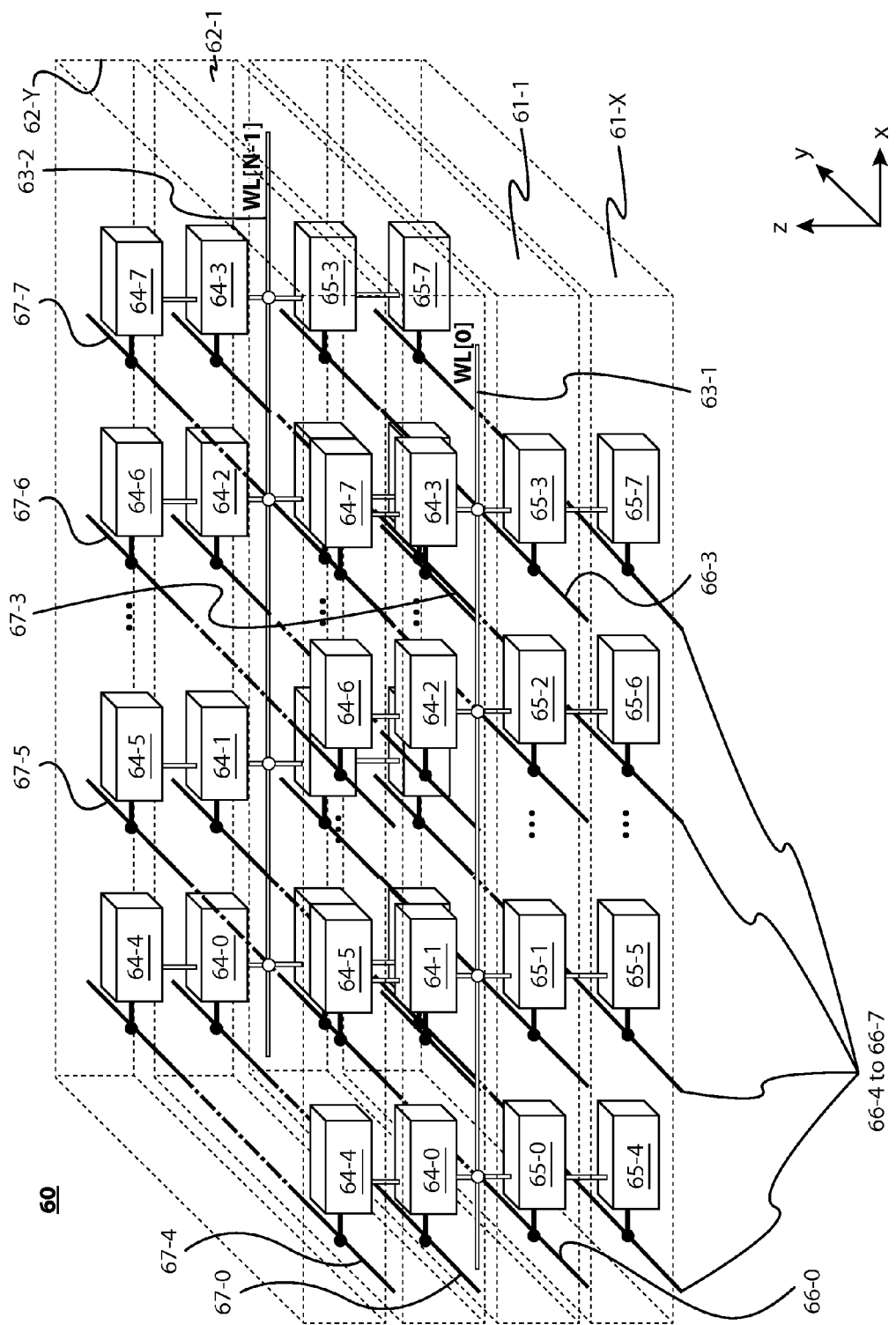
FIG. 6 is a perspective view of a three-dimensional semiconductor integrated circuit with bit cells on a predetermined number of different vertical layers above and below a shared wordline in accordance with some embodiments.

FIG. 6 illustrates a 3D IC 60 with bit cells on a number, X, of different vertical layers below a shared wordline and with bit cells on a number, Y, of different vertical layers above the shared wordline in accordance with some embodiments. 3D IC 60 includes a plurality of layers such as layers 61-1 to 61-X that are vertically stacked on top of one another in the z-direction below the shared wordline and a plurality of layers such as layers 62-1 to 62-Y vertically stacked above the shared wordline. In some embodiments as explained above, layers 61-1 to 61-X and 62-1 to 62-Y are individual dies that are electrically coupled to one another with at least one TSV, TDV, or ILV (not shown). In some embodiments, each layer of 3D IC 60 is a respective "tier" where each tier includes a respective active device layer and a respective interconnect structure, which can include a plurality of conductive layers (e.g., M1, M2, etc.). ILD layers (not shown) can be disposed between directly adjacent tiers as will be understood by one of ordinary skill in the art.

3D IC 60 includes an array of bit cells arranged across the X number of layers below the wordlines 63-1 and 63-2 and across the Y number of layers above the wordlines 63-1 and 63-2. Bit cells 65-0 through 65-3 coupled to wordline 63-1 and another corresponding set of bit cells coupled to wordline 63-2 are disposed on layer 61-1, bits cells 65-4 through 65-7 coupled to wordline 63-1 and another corresponding set of bit cells coupled to wordline 63-2 are disposed on layer 61-X. Bit cells 64-0 through 64-3 coupled to wordline 63-1 and another corresponding set of bit cells coupled to wordline 63-2 are disposed on layer 62-1, bits cells 64-4 through 64-7 coupled to wordline 63-1 and another corresponding set of bit cells coupled to wordline 63-2 are disposed on layer 62-Y.

Bit cells 65-0 through 65-3 and bit cells 65-4 through 65-7 correspondingly share the same wordline 63-1 residing above bit cells 65-0 through 65-7. Furthermore, bit cells 64-0 through 64-3 and bit cells 64-4 through 64-7 correspondingly share the same wordline 66-0 residing below bit cells 64-0 through 64-7. Another set of bit cells correspondingly share wordline 63-2 in a similar arrangement. 3D IC 60 further includes a number of bit lines. Bit lines 66-0 to 66-3 can correspondingly drive bit cells 65-0 through 65-3 to store a logic zero or a logic one in a storage node 124, 142 (FIG. 1A) or can be coupled to storage nodes 124, 142 to read a logic zero or a logic one from one of the storage nodes. Bit lines 66-4 to 66-7 (FIG. 6) can correspondingly drive bit cells 65-4 through 65-7 to store a logic zero or a logic one in storage nodes 124, 142 (FIG. 1A) or can be coupled to storage nodes 124, 142 to read a logic zero or a logic one from one of the storage nodes. Bit lines 67-0 to 67-3 (FIG. 6) can correspondingly drive bit cells 64-0 through 64-3 to store a logic zero or a logic one in storage nodes 124, 142 (FIG. 1A) or can be coupled to storage nodes 124, 142 to read a logic zero or a logic one from the storage nodes, and bit lines 67-4 to 67-7 (FIG. 6) can correspondingly drive bit cells 64-4 through 64-7 to store a logic zero or a logic one in storage nodes 124, 142 (FIG. 1A) or can be coupled to storage nodes 124, 142 to read a logic zero or a logic one from the storage nodes.

Figure 7:
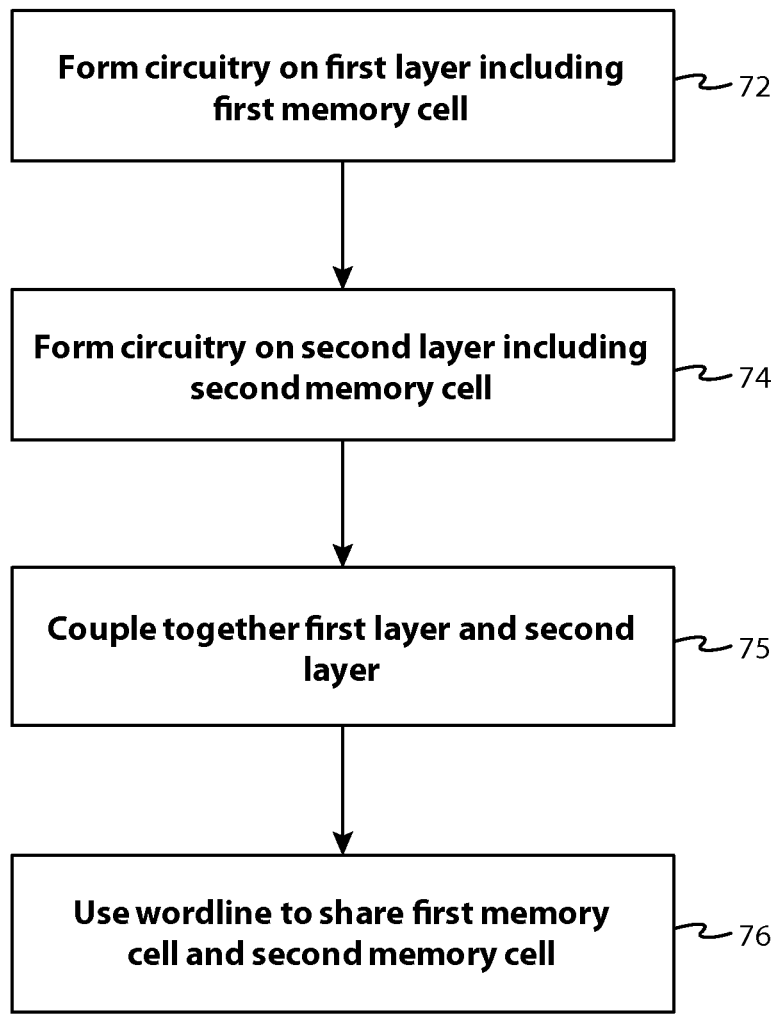
FIG. 7 is a flow diagram of one example of a method of forming a three-dimensional semiconductor memory in accordance with some embodiments.

FIG. 7 is a flow diagram of one example of a method 70 of manufacturing a three-dimensional semiconductor memory in accordance with some embodiments. At block 72, circuitry is formed in and/or on a first layer. For example, the active devices of the bit or memory cells (e.g., transistors 128, 128, 144,146) of a bit cell array are formed in a semiconductor substrate (not shown) using a semiconductor processing technology. In some embodiments, the bit cells are formed using complementary metal oxide semiconductor ("CMOS") semiconductor processing technology.

At block 74, circuitry is formed in and/or on the second layer. For example, the active devices including a second bit or memory cell or set of memory or bit (e.g., transistors 128, 128, 144,146) cell are formed in another semiconductor substrate (not shown) using a semiconductor processing technology. In some embodiments, the bit cells or memory cells are formed using CMOS semiconductor processing technology.

At block 75, the first and second layers are coupled together. For example, if first and second layers 11 and 12 of FIG. 1 are separate semiconductor chips, then layers 11 and 12 are vertically stacked on top of one another, aligned, and bonded together. In some embodiments, such as embodiments in which layers 11 and 12 are tiers, the layers are stacked on top of one another to create a 3D stacked CMOS IC. One of ordinary skill in the art will understand that one or more layers can be disposed between layers 11 and 12 in some embodiments.

At block 76, part of the circuitry formed in either the first layer or the second layer includes a wordline of the word which is used to share the first memory cell and the second memory cell where the first memory cell and the second memory cell are formed on separate layers. In some embodiments, the wordline and other conductive lines are embedded in metal layers (e.g., M1, M2, etc.) in either layer 11 or layer 12 (FIG. 1) or formed between layers 11 and 12 to couple respective bit cells via a wordline 13 or wordline 14 (FIG. 1). In some embodiments, the conductive lines are TSVs or ILVs.

The disclosed circuits and methods described herein advantageously reduce issues that can affect conventional two-dimensional semiconductor memories by decreasing resistance and capacitance as a result of reduced wordline lengths. The implementation of a stacked bit cell array sharing wordlines further improves area efficiency. Additionally, the disclosed circuits and methods improves the performance of a semiconductor memory in terms of power and speed.

In some embodiments, a 3D IC includes a first layer including at least a first memory cell, a second layer including at least a second memory cell, and a wordline shared by the first memory cell and the second memory cell. The second layer disposed in a vertical stack with the first layer.

In some embodiments the first memory cell and the second memory cell are horizontally adjacent memory cells coupled to different bit lines.

In some embodiments the first memory cell and the second memory cell are vertically adjacent memory cells coupled to different bit lines. In some embodiments the different bit lines include a first bit line in the first layer and a second bit line in the second layer.

In some embodiments the first layer includes a first plurality of memory cells, the second layer includes a second plurality of memory cells, and the wordline is shared by the first plurality of memory cells and the second plurality of memory cells. In some embodiments, the wordline extends horizontally across one of the first layer or the second layer and is shared with the first plurality of memory cells disposed vertically above the wordline and with the second plurality of memory cells disposed vertically below the wordline.

In some embodiments, the wordline extends horizontally across one of the first layer or the second layer and is shared with the first plurality of memory cells and the second plurality of memory cells both disposed vertically below the wordline.

In some embodiments, the 3D circuit includes a first plurality of memory cells disposed in the first layer, a second plurality of memory cells disposed in the second layer, and respective pluralities of memory cells disposed in adjacent respective layers below the first and second layers, wherein the wordline extends horizontally across and above the first plurality of memory cells and is shared with the first plurality of memory cells, the second plurality of memory cells, and the respective pluralities of memory cells all disposed vertically below the wordline.

In some embodiments, the 3D circuit further includes a first plurality of memory cells disposed above the first layer in respective layers above the first layer, and a second plurality of memory cells disposed below the second layer in respective layers below the second layer, wherein the wordline is a horizontal wordline disposed between the first layer and the second layer and the horizontal wordline is shared with the first plurality of memory cells and the second plurality of memory cells.

In some embodiments, the first memory cell and the second memory cells are adjacent static random access memory cells.

In some embodiments, the wordline extends vertically from the first layer to the second layer and is shared among memory cells on separate layers with memory cells including the first memory cell disposed horizontally to the left of the wordline and memory cells disposed horizontally to the right of the wordline.

In some embodiments, a semiconductor memory includes a bit cell array including a first memory cell of the bit cell array disposed in a first layer and a second memory cell of the bit cell array disposed in a second layer. A wordline is shared by the first memory cell and the second memory cell of the bit cell array. The first and second layers are arranged in a vertical stack.

In some embodiments, the first memory cell and the second memory cell are vertically adjacent memory cells coupled to different bit lines. In some embodiments, the different bit lines include a first bit line in the first layer and a second bit line in the second layer.

In some embodiments, a method includes the steps of forming circuitry on a first layer, the circuitry on the first layer including a first memory cell, forming circuitry on a second layer, the circuitry on the second layer including a second memory cell, and forming a wordline such that the wordline is share by the first memory cell and the second memory cell.

In some embodiments, the first memory cell and the second memory cells are formed as horizontally adjacent memory cells coupled to different bit lines. In some embodiments, the first memory cell and the second memory cell are formed as vertically adjacent memory cells coupled to different bit lines.

In some embodiments, the method further includes coupling the first layer and the second layer together.

In some embodiments, the method includes coupling the first memory cell and the second memory cell via the wordline using through-silicon-vias.

In some embodiments, the first layer includes a first plurality of memory cells for the word, the second layer includes a second plurality of memory cells for the word, and the wordline for the word is shared by the first plurality of memory cells and the second plurality of memory cells.

Although the circuits and methods have been described in terms of exemplary embodiments, they are not limited thereto. Rather, the appended claims should be construed broadly, to include other variants and embodiments of the circuits and methods, which may be made by those skilled in the art without departing from the scope and range of equivalents of the circuits and methods.

What is claimed is:

1. A three dimensional (3D) circuit, comprising:
a first layer including at least a first memory cell;
a second layer including at least a second memory cell, the second layer disposed in a vertical stack with the first layer; and
a wordline shared by the first memory cell and the second memory cell, wherein the wordline extends vertically from the first layer to the second layer and is shared among memory cells on separate layers with memory cells including the first memory cell disposed horizontally on a first side of the wordline and memory cells including the second memory cell disposed horizontally on a second side of the wordline opposite the first side of the wordline.

2. The 3D circuit of claim 1, wherein the first memory cell and the second memory cell are vertically adjacent memory cells coupled to different bit lines.

3. The 3D circuit of claim 2, wherein the different bit lines include a first bit line in the first layer and a second bit line in the second layer.

4. The 3D circuit of claim 1, wherein the first layer includes a first plurality of memory cells, the second layer includes a second plurality of memory cells, and the wordline is shared by the first plurality of memory cells and the second plurality of memory cells.

5. The 3D circuit of claim 4, wherein the wordline extends horizontally across one of the first layer or the second layer and is shared with the first plurality of memory cells disposed vertically above the wordline and with the second plurality of memory cells disposed vertically below the wordline.

6. The 3D circuit of claim 4, wherein the wordline extends horizontally across one of the first layer or the second layer and is shared with the first plurality of memory cells and the second plurality of memory cells both disposed vertically below the wordline.

7. The 3D circuit of claim 1, further comprising a first plurality of memory cells disposed in the first layer, a second plurality of memory cells disposed in the second layer, and respective pluralities of memory cells disposed in adjacent respective layers below the first and second layers, wherein the wordline extends horizontally across and above the first plurality of memory cells and is shared with the first plurality of memory cells, the second plurality of memory cells, and the respective pluralities of memory cells all disposed vertically below and connected to the wordline via a plurality of vias.

8. The 3D circuit of claim 1, further comprising a first plurality of memory cells disposed above the first layer in respective layers above the first layer, and a second plurality of memory cells disposed below the second layer in respective layers below the second layer, wherein the wordline is a horizontal wordline disposed between the first layer and the second layer and the horizontal wordline is shared with the first plurality of memory cells and the second plurality of memory cells via a plurality of vias.

9. The 3D circuit of claim 1, wherein the first memory cell and the second memory cells are adjacent static random access memory cells.

10. A semiconductor memory, comprising:
a bit cell array, comprising:
a first memory cell of the bit cell array disposed in a first layer;
a second memory cell of the bit cell array disposed in a second layer, the second layer disposed in a vertical stack with the first layer; and a wordline shared by the first memory cell and the second memory cell of the bit cell array, wherein the wordline resides above the first memory cell disposed in the first layer and the second memory cell disposed in the second layer.

11. The semiconductor memory of claim 10, wherein the first memory cell and the second memory cell are vertically adjacent memory cells coupled to different bit lines.

12. The semiconductor memory of claim 11, wherein the different bit lines include a first bit line in the first layer and a second bit line in the second layer.

13. A method, comprising:
 forming circuitry on a first layer, the circuitry on the first layer including a first memory cell;
 forming circuitry on a second layer, the circuitry on the second layer including a second memory cell; and
 forming a wordline such that the wordline is shared by the first memory cell and the second memory cell, wherein the wordline resides above the first memory cell formed in the first layer and the second memory cell formed in the second layer.

14. The method of claim 13, wherein the first memory cell and the second memory cells are formed as horizontally adjacent memory cells coupled to different bit lines.

15. The method of claim 14, wherein the first memory cell and the second memory cell are formed as vertically adjacent memory cells coupled to different bit lines.

16. The method of claim 13, wherein the method further comprises coupling the first layer and the second layer together.

17. The method of claim 13, wherein the method comprises coupling the first memory cell and the second memory cell via the wordline using through-silicon-vias.

18. The method of claim 13, wherein the first layer includes a first plurality of memory cells for the wordline, the second layer includes a second plurality of memory cells for the wordline, and the wordline is shared by the first plurality of memory cells and the second plurality of memory cells.

* * * * *